United States Patent [19]  
Cole

[11] 4,424,103  
[45] Jan. 3, 1984

[54] THIN FILM DEPOSITION

[75] Inventor: Barrett E. Cole, Bloomington, Minn.

[73] Assignee: Honeywell Inc., Minneapolis, Minn.

[21] Appl. No.: 481,553

[22] Filed: Apr. 4, 1983

[51] Int. Cl.$^3$ ............................................. C23C 15/00
[52] U.S. Cl. .......................... 204/192 R; 204/192 N; 204/298
[58] Field of Search ................ 204/298, 192 R, 192 N

[56] References Cited

U.S. PATENT DOCUMENTS

| 4,036,167 | 7/1977 | Lu ........................................ 204/298 |
| 4,142,958 | 3/1979 | Wei et al. | |
| 4,250,009 | 2/1981 | Cuomo et al. ........................ 204/298 |
| 4,381,453 | 4/1983 | Cuomo et al. ........................ 204/298 |

OTHER PUBLICATIONS

Kaufman, J. Vac. Sci. Technol., 15(2), 1978, pp. 272–276.
J. M. E. Harper and H. R. Kaufman; "Technique for Improved Selectivity in Ion Beam Etching", Oct. 1980, 2143–2145.
J. J. Cuomo and J. M. E. Harper; "Multicomponent Film Deposition by Target Biasing", Jul. 1980, 817–818.
J. M. E. Harper and M. Heiblum; "Dual-Ion-Beam Technique for Pinhole Free Thin Films of Controlled Thickness", Jul. 1980, 821–822.
J. J. Cuomo, J. M. E. Harper & H. R. Kaufman, "Small Ion Sources for Large Area Ion Milling", Jan. 1979, 3373–3375.

Primary Examiner—Arthur P. Demers
Attorney, Agent, or Firm—John P. Sumner

[57] ABSTRACT

Disclosed is a method and apparatus for thin film deposition comprising bombarding a target obliquely in a vacuum chamber with a linear ion gun. The linear ion gun generates an ion beam which impacts the target over an area having a width substantially greater than a height. Target material in the impacted area is sputtered. The sputtered target material is deposited onto a surface by translating the surface at a controlled rate through the sputtered material.

8 Claims, 1 Drawing Figure

U.S. Patent  Jan. 3, 1984  4,424,103
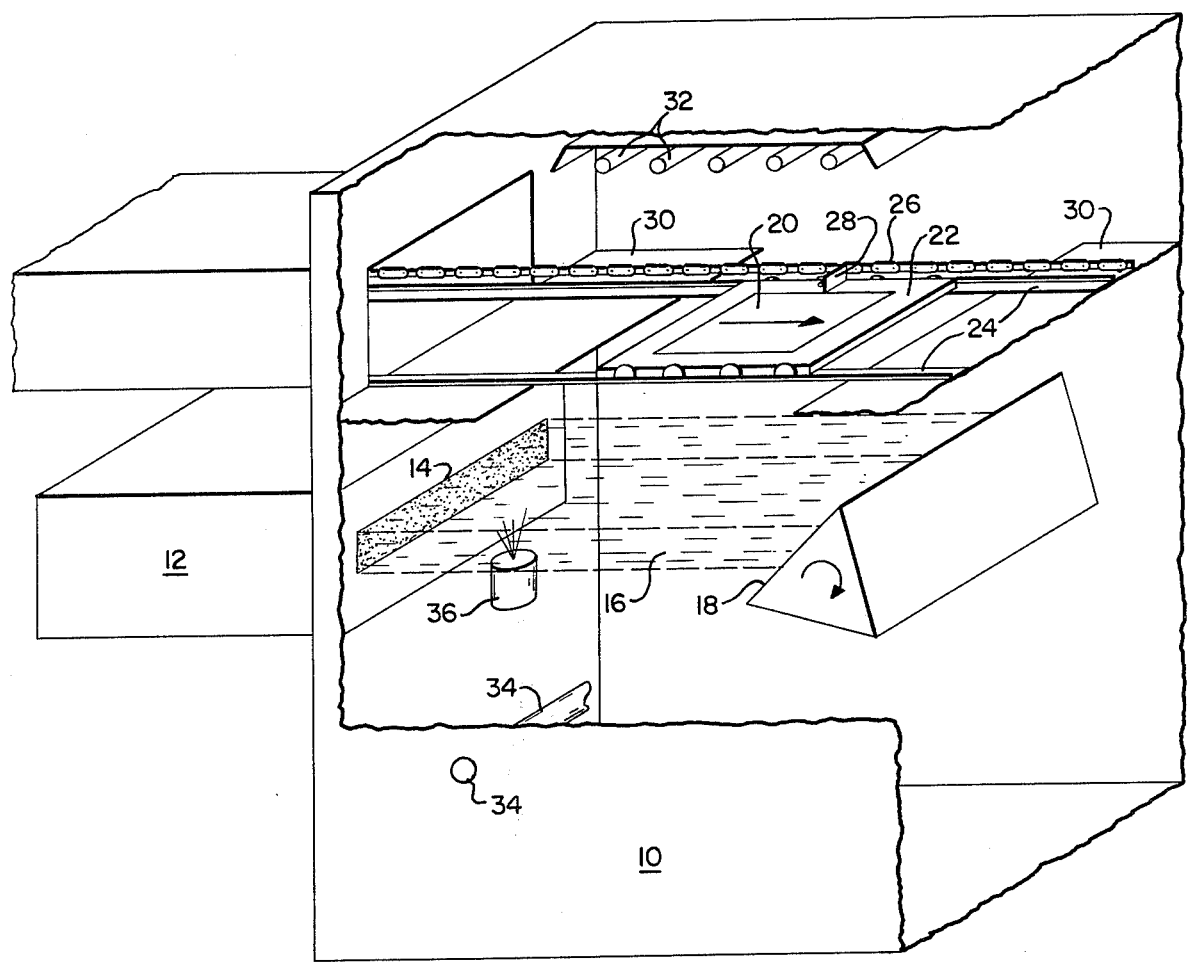

THIN FILM DEPOSITION

BACKGROUND OF THE INVENTION

The present invention is a thin film deposition method and apparatus comprising ion beam sputtering of target materials such as metals, dielectrics, and semiconductors. The invention uses a linear ion gun as the ion source. Because of the beam uniformity and large width, large substrates or other surfaces and/or a plurality of small surfaces or substrates can be coated with high thickness uniformity and optimal deposition rates.

Ion beam sputtered films have properties superior to those of films deposited by other physical processes such as e-beam or thermal processes, RF sputtering, and magnetron sputtering. Ion beam sputtering permits the deposition of dense, low defect, low scatter, amorphous films which are desired in many processing environments where moisture permeability, sputter damage, and surface roughness are critical for optimal device operation and reliability.

In the prior art, however, ion beam sputtered films are limited to small surface or substrate sizes and low production rates. In prior art processes, a round ion beam sputters a target in a highly localized manner, and uniform coatings can be made only on small surfaces, and then only by keeping the surfaces in constant rotary motion such as in a planetary fixture. Uniformity is also attained in such prior art processes by locating the surfaces or substrates at a considerable distance from the target relative to surface or substrate size and by shaping the planetary fixtures in a variety of shapes so that the flux reaching each element is approximately equal.

Accordingly, the present invention was developed. The present invention provides a procedure and apparatus for depositing material uniformly onto large surfaces or simultaneously unto many small surfaces while maintaining the film advantages inherent to ion beam sputtering processes.

SUMMARY OF THE INVENTION

The present invention is a method and apparatus for thin film deposition comprising bombarding a target obliquely in a vacuum chamber with a linear ion gun. The linear ion gun generates an ion beam which impacts the target over an area having a width substantially greater than a height. Target material in the impacted area is sputtered. The sputtered target material is deposited onto a surface by translating the surface at a controlled rate through the sputtered material.

BRIEF DESCRIPTION OF THE DRAWING

The FIGURE schematically illustrates apparatus compatible with the present invention.

DESCRIPTION OF THE PREFERRED EMBODIMENT

The FIGURE illustrates a vacuum chamber 10 coupled to a linear ion gun 12 comprising an aperture 14 having a width substantially greater than a height. Ion gun 12 may comprise, for example, a linear ion source having a beam aperture 44 centimeters wide by 5 centimeters high. Such linear ion sources are available from Ion Tech, Inc., Fort Collins, Colo. 80522.

Aperture 14 emits a slightly divergent ion beam 16 having a cross-section at the target substantially equal to the size of aperture 14. The atmosphere within ion gun 12 is controlled to provide sufficient gas to sustain a discharge which generates ion beam 16. Ion beam 16 impacts target 18, which may be a rotatable multi-target assembly for use in applying more than one material in the same vacuum cycle.

The impacted target area provides a path of sputtered target material which sputters in all directions forward of the target and provides a path of sputtered material through which a surface (such as the underside of a substrate 20) is translated at a controlled rate. The apparatus shown for translating the surface includes a cart 22 riding on rails 24 and driven by a chain and sprocket drive assembly, schematically shown by chain 26 and chain latch 28 attached to cart 22 (as previously indicated, cart 22 may comprise means (not shown) for simultaneously translating a plurality of small surfaces).

Masks 30 may be employed to prevent undesired coating of sputtered target material.

The thickness of the thin film deposited is a function of the surface translation rate and the ion beam current. Except for edge effects, the thickness uniformity is typically 5% because of the lateral uniformity of the ion flux emerging from gun 12. The maximum width of the surface to be coated depends upon beam width and, with presently available linear ion guns, can be as much as 44 centimeters before it is necessary to gang ion guns in a lateral array.

The maximum length of the surface to be coated depends only upon the physical length of the vacuum transport system. Infrared heating lamps 32 may be used together with an optical pyrometer and a lamp controller to regulate surface temperature. An optical source/detector photometer subsystem may be located downstream from the deposition to monitor the transmittance (and hence thickness) of transparent films deposited on either a transparent material or a transparent test slice in order to monitor film thickness in production runs. Quartz crystal oscillator thickness monitoring may also be used to obtain thickness control for nontransparent materials. Slight deviations from the desired film thickness may be corrected for by automatically proportionately changing either ion beam sputter current or the translation velocity of carriage 22.

An input port 34, together with an array of nozzles (not shown) aimed at target 18, is used to add additional gases to improve film stochiometry for nonmetallic depositions. An electron source 36 is used to neutralize charged ion beam 16 when nonconductive materials such as dielectrics or when semiconductor materials are sputtered.

The embodiments of the invention in which an exclusive property or right is claimed are defined as follows:

1. A method of thin film deposition, comprising:
   bombarding a target obliquely in a vacuum chamber with a linear ion gun, the linear ion gun generating an ion beam which impacts the target over an area having a width substantially greater than a height, target material in the impacted area being sputtered; and
   depositing the sputtered target material onto a surface by translating the surface at a controlled rate through the sputtered material.

2. The method of claim 1 wherein the bombarding step comprises bombarding a conductive target for depositing sputtered conductive material onto the surface.

3. The method of claim 1 wherein the bombarding step comprises bombarding a nonconductive target for depositing sputtered nonconductive material onto the surface.

4. The method of claim 1 wherein the bombarding step comprises bombarding a semiconductor target for depositing sputtered semiconductor material onto the surface.

5. Apparatus for thin film deposition, comprising:
linear ion gun means for generating an ion beam having a width substantially greater than a height and for sputtering target material from a target area having a width substantially greater than a height; and means for translating a surface at a controlled rate through the sputtered target material in order to deposit a thin film onto the surface.

6. The apparatus of claim 5 wherein the linear ion gun means comprises means for sputtering target material from a conductive target.

7. The apparatus of claim 5 wherein the linear ion gun means comprises means for sputtering target material from a nonconductive target.

8. The apparatus of claim 5 wherein the linear ion gun means comprises means for sputtering target material from a semiconductor target.

* * * * *